US008622368B2

(12) United States Patent
Geiser

(10) Patent No.: US 8,622,368 B2
(45) Date of Patent: Jan. 7, 2014

(54) FLAP TRANSFER VALVE WITH PIVOTABLE VALVE CLOSURE BEAM

(75) Inventor: Friedrich Geiser, Nueziders (AT)

(73) Assignee: VAT Holding AG (CH)

( * ) Notice: Subject to any disclaimer, the term of this patent is extended or adjusted under 35 U.S.C. 154(b) by 313 days.

(21) Appl. No.: 13/020,248

(22) Filed: Feb. 3, 2011

(65) Prior Publication Data

US 2011/0186762 A1 Aug. 4, 2011

(30) Foreign Application Priority Data

Feb. 4, 2010 (EP) .................................. 10152682

(51) Int. Cl.
*F16K 1/16* (2006.01)

(52) U.S. Cl.
USPC ............. 251/301; 251/228; 251/279; 251/84

(58) Field of Classification Search
USPC ............... 251/84–85, 87, 228, 279, 298–301
See application file for complete search history.

(56) References Cited

U.S. PATENT DOCUMENTS

| | | | | |
|---|---|---|---|---|
| 1,602,236 A | * | 10/1926 | Marscheider et al. | 251/228 |
| 2,394,471 A | * | 2/1946 | Paul | 251/228 |
| 3,062,232 A | * | 11/1962 | McGay | 137/495 |
| 3,084,904 A | * | 4/1963 | McGay | 251/218 |
| 3,521,659 A | * | 7/1970 | Seger | 137/112 |
| 4,785,962 A | | 11/1988 | Toshima | |
| 4,809,950 A | | 3/1989 | Geiser | |
| 4,821,507 A | * | 4/1989 | Bachmann et al. | 60/39.182 |
| 4,881,717 A | | 11/1989 | Geiser | |
| 4,919,169 A | * | 4/1990 | Bachmann et al. | 137/875 |
| 4,921,003 A | * | 5/1990 | Horvei | 137/315.16 |
| 5,076,205 A | | 12/1991 | Vowles | |
| 5,205,532 A | | 4/1993 | Naehring | |
| 5,275,303 A | | 1/1994 | Szalai | |
| 5,292,393 A | | 3/1994 | Maydan | |
| 5,697,596 A | * | 12/1997 | Kremers et al. | 251/58 |
| 6,056,266 A | | 5/2000 | Blecha | |
| 6,343,618 B1 | * | 2/2002 | Britt et al. | 137/527 |
| 6,416,037 B1 | | 7/2002 | Geiser | |
| 6,471,181 B2 | * | 10/2002 | Duelli | 251/85 |
| 6,629,682 B2 | | 10/2003 | Duelli | |
| 2005/0263732 A1 | * | 12/2005 | Kurian et al. | 251/298 |
| 2005/0274923 A1 | | 12/2005 | Tanase | |
| 2007/0186851 A1 | | 8/2007 | Geiser | |

FOREIGN PATENT DOCUMENTS

| | | |
|---|---|---|
| DE | 802855 C | 2/1951 |
| EP | 0496604 A2 | 7/1992 |
| EP | 0 554 522 | 8/1993 |

* cited by examiner

*Primary Examiner* — John K Fristoe, Jr.
*Assistant Examiner* — Jessica Cahill
(74) *Attorney, Agent, or Firm* — Muncy, Geissler, Olds & Lowe, PLLC

(57) ABSTRACT

A flap transfer valve is disclosed for the transfer of semiconductor elements or substrates into a semiconductor or substrate processing process chamber having an elongated first opening, which is surrounded in the form of a frame by a first sealing surface on a first sealing plane, and an elongated valve closure beam, having a second sealing surface which corresponds to the first sealing surface, can be brought into gastight contact with it, and is located on a second sealing plane. A support is arranged on the rear face of the valve closure beam, which is arranged such that it can pivot through a limited pivoting angle about a tilting axis. The support together with the valve closure beam can pivot about a pivoting axis, which lies on the first sealing plane, and the tilting axis lies on the second sealing plane.

15 Claims, 5 Drawing Sheets

FLAP TRANSFER VALVE WITH PIVOTABLE VALVE CLOSURE BEAM

This application claims priority to European Patent Application No. 10152682.0, which was filed in the EPO on Feb. 4, 2010, and which is herein incorporated by reference in its' entirety.

The invention relates to a flap transfer valve for the transfer of semiconductor elements or substrates into a semiconductor or substrate processing process chamber which can be isolated in a gas-tight manner according to the precharacterizing clause of Claim 1.

A flap transfer valve such as this is known from EP 0 554 522.

Various vacuum valves are used in particular in the field of IC and semiconductor manufacture, which has to be carried out in a protected atmosphere, as far as possible without the presence of contaminating particles. By way of example, in a manufacturing installation for semiconductor wafers or liquid crystal substrates, the highly sensitive semiconductor or liquid crystal elements pass sequentially through a plurality of process chambers, in which the semiconductor elements located within the process chamber are processed by means of a respective processing apparatus. Both during the processing process within the process chamber and during the transfer from one process chamber to another, the highly sensitive semiconductor elements must always be located in a protected atmosphere—in particular in an environment which is free of air and particles, or in an inert gas atmosphere.

By way of example, the process chambers are connected to one another via transfer channels. These process chambers can be opened by means of vacuum transfer valves for transferring the parts from one process chamber to the next, and can be closed in a gas-tight manner after carrying out the respective manufacturing step. Furthermore, moving transfer chambers are used, which can dock with the process chambers and can transport the semiconductor elements in an inert-gas atmosphere between the process chambers.

The prior art, for example U.S. Pat. No. 5,076,205 or U.S. Pat. No. 5,292,393, discloses multi-chamber systems for the production of semiconductor elements—in particular semiconductor wafers—in which a plurality of process chambers are arranged in the form of a star around a central transfer chamber. The central transfer chamber is connected via a tunnel to a second transfer chamber, around which further process chambers are arranged in the form of a star, in such a way that a large, cohesive semiconductor manufacturing system can be produced by means of a multiplicity of such processing islands. The semiconductor elements are transported from one process chamber via the transfer chamber into the next process chamber by means of a handling system which is arranged in the transfer chamber.

Furthermore, the prior art discloses vacuum chamber systems whose process chambers are arranged along a line and have openings which can be closed in a vacuum-tight manner and face in the same direction. A transfer chamber which can be moved linearly parallel to the process chamber line can be docked with the individual process chambers, and is used to transport the components from one process chamber to the next. The evacuated transfer chamber for this purpose is docked in a vacuum-tight manner with a process chamber opening, by means of its transfer chamber opening. A system such as this has been described, for example, in a general form in US-2007-0186851-A1 (Geiser).

It is also possible to arrange the process chambers sequentially in a row of process chambers, wherein a connecting opening is provided between the adjacent process chambers and can be closed in a gas-tight manner by means of a transfer valve. Each process chamber in this case has at least two openings, wherein the output opening of one process chamber is in each case the input opening of a following process chamber in the process chamber chain. There is in each case a transfer valve between each two process chambers and at the start and end of the process chamber chain, which transfer valve in each case has two valve openings, which can be separated from one another in a gas-tight manner, in its valve housing.

The vacuum chamber systems described are used for different areas of semiconductor and substrate manufacture and have been proven for the production and processing of small to medium-size semiconductor and substrate components. However, new technical fields require ever larger integral semiconductor components and substrates, which necessitate the procurement of new manufacturing systems. Examples of this are solar panels or screen panels, in particular plasma and LCD panels, with a width of more than one meter. Process chambers and transfer valves with correspondingly large dimensions are required to process such large semiconductor components, liquid crystal substrates or other substrates.

In general, for the purposes of material science, a substrate means a material to be treated in which case, in particular, the surface of the substrate is refined or coated. This may be a wafer from the field of semiconductor technology, a base material of a printed circuit board or some other material, in particular in the form of a board or strip, which is processed appropriately by means of a coating, refining or handling process, which has to be carried out in a vacuum or in a process gas environment. The term substrate also covers a glass plate to be coated, for example for a flat screen or a solar panel with a thickness of less than 0.5 to more than 5 millimeters, or a stainless steel foil, or a stainless steel strip with a thickness of less than 0.05 to more than 0.2 millimeters.

Such transfer valves for opening and closing process chambers are therefore distinguished, depending on the respective process, by extraordinarily large dimensions, a long sealing length and a very large opening cross section, in some cases with a width of more than 1000 millimeters. In particular, the opening cross sections are elongated and like slots, with the width being considerably greater than the height of the opening. Because of the described field of application and the dimensions associated with it, these valves are referred to as transfer valves, while because of their rectangular opening cross section, they are also referred to as rectangular valves and, depending on their method of operation, also as slide valves, rectangular slides, transfer slide valves, flap valves, flap transfer valves or rotating sluices.

U.S. Pat. No. 6,416,037 (Geiser) and U.S. Pat. No. 6,056,266 (Blecha) describe transfer valves with small dimensions, in the form of vacuum slide valves or slide valves, also referred to as valve slides or rectangular slides. In the prior art, the closing and opening processes are generally carried out in two steps. In a first step, a valve closure, in particular a closure plate, is moved linearly over an opening, essentially parallel to the valve seat, without any contact taking place during this process between the valve closure and the valve seat of the valve housing. In a second step, the closure face of the valve closure is pressed against the valve seat of the valve housing, thus closing the opening in a gas-tight manner. The seal can be achieved for example either via a sealing ring, which is arranged on the closure face of the valve closure and is pressed against the valve seat which runs around the opening, or via a sealing ring on the valve seat, against which the closure face of the valve closure is pressed.

In addition, relatively small slide valves are known, in which the closing and sealing process is carried out by means of a single linear movement. One such valve is, for example, the transfer valve from the company VAT Vakuumventile AG in Haag, Switzerland, which is known under the product name "MONOVAT Series 02 and 03" and is in the form of a rectangular insert valve. The design and method of operation of a valve such as this are described, for example, in U.S. Pat. No. 4,809,950 (Geiser) and U.S. Pat. No. 4,881,717 (Geiser).

Drive techniques such as these have been proven in the prior art, but they are suitable only to a limited extent for very large opening cross sections, in particular elongated, slot-like opening cross sections.

Because of the long sealing lengths which result from the large opening cross section, the requirements for the seals, the guidance of the valve closure and for the drive are very stringent.

Various sealing apparatuses are known from the prior art, for example from U.S. Pat. No. 6,629,682 B2 (Duelli). One suitable material for sealing rings is, for example, the elastic sealing material known by the tradename Viton®.

In the case of long sealing lengths and large opening cross sections such as these, one particular requirement is to ensure the sealing over the entire sealing length, even when the pressure differences are very high. The sealing behavior of the seals that are used is generally limited to a very narrow range. If the distance between the valve closure and the valve seat exceeds a specific limit value, the contact force of the seal on the valve seat is too low, and the sealing is no longer ensured. In contrast, if the distance between the valve closure and the valve seat is too short, and the contact force of the seal on the valve seat is therefore too great, the seal is subject to considerable wear, and will in some circumstances be destroyed. For this reason, when the valve is in the closed state, a certain contact pressure must always be maintained between the seal and the valve seat over the entire length of the seal, even when the pressure differences are high. This certain contact pressure is limited to a relatively narrow range.

Particularly in the case of valves with large dimensions, in particular with a pronounced asymmetric cross section, for example an elongated, slot-like opening, there are problems in maintaining a constant contact pressure when the pressure differences are relatively high. In order to maintain a constant contact pressure, certain transfer valves provide for the valve closure and its drive as well as its bearing to be designed to be particularly robust, such that the valve closure maintains its nominal position, and does not undesirably change its position, even when high forces occur, which because of the pressure difference have an effect on the valve closure. A design of the valve closure and of its drive and bearing components which is as robust and inelastic as possible initially appears to be obvious. However, a further problem does not just involve the possibly elastic behavior of the valve closure and its periphery. In the case of process chambers with large dimensions, the pressure differences between the chamber interior and the surrounding area, or between two chambers, result in deformation of the entire chamber wall. The transfer valve which is arranged on the chamber wall and is coupled to it is likewise subject to this deformation of the chamber wall. Since the valve seat, which is coupled to the chamber wall, is deformed in a corresponding manner to the curvature of the chamber wall, a constant contact pressure of the seal along the sealing length is not ensured with an undeformed valve closure.

A further problem is that gravitational forces can occur between the seal and the valve seat when the chamber wall deforms. In other words, the seal is loaded transversely with respect to the contact force. A lateral shear load such as this leads to considerable wear to the seal, and even to destruction of the seal, as a result of which the required gas-tightness is no longer ensured.

EP 0 554 522 A2 discloses a rotating sluice for removing a substrate from one treatment chamber and for introducing it into an adjacent treatment chamber, or for removing it from the atmospheric area to a chamber at a lower pressure, in particular a slot sluice for a continuous-flow vacuum coating installation with a flap-like valve plate, which is held in fixed-position bearings, and two closing motors, which interact therewith. The valve plate is articulated on a valve beam with the interposition of two sprung bars, which valve beam itself has two bearing journals, which are diametrically opposite one another and are coupled to the shafts of the motors such that they rotate together, with the shafts of the motors being passed through the wall of the chamber in a pressure-resistant manner. The attachment of the valve plate to the valve beam with the aid of two spring bars is intended to represent a connection which can move on two axes with respect to one another, and is free of joints and therefore free of friction, with the aim of preventing the relative movements which occur between the valve plate and the valve beam during valve operation from producing joint friction, and therefore also wear particles. The spring bars are arranged on the valve plate and on the valve beam such that they are pressed with the aid of special clamping pieces into appropriate grooves, which are milled out in a V-shape. These V-grooves are designed such that, when there is no stress on the spring bars, the valve plate assumes a position, which is defined not to be parallel, with respect to the valve beam, such that, during the closing process, the valve plate sealing surface rests both on the O-ring on the outside and on the O-ring on the inside, at the same time. This arrangement is intended to ensure that the seal is protected and that a uniform closing force and contact force can be produced over the entire length of the valve plate. During maintenance and repair, it should be possible to replace the pressure step and drive unit without any problems, while the comparatively bulky and heavy valve unit remains completely installed in the recipient. One disadvantage of the described rotating sluice is that, when the seal presses against the valve seat, there is necessarily a certain lateral shear load on the seal because the position of the valve plate is not parallel to the valve beam and the wall may be deformed.

The need for as constant a contact force as possible along the sealing length of the seal of a transfer valve even in the event of unavoidable elastic deformation of the valve seat and of the valve closure, such as the deformation which occurs in particular in the case of elongated, in particular slot-like opening cross sections, as well as the avoidance of non-uniform loading or a lateral load on the seal, represent a problem which has not yet been adequately solved in the prior art.

The present invention is therefore based on the object of designing a transfer valve, which has an elongated, in particular slot-like, first opening, such that excessive loading on the seal and the production of particles which are hazardous to the process are avoided both when the seal is pressed against the valve seat and when the valve wall is deformed.

This object is achieved by the implementation of the features of the independent claim. Features which develop the invention in an alternative or advantageous manner are specified in the dependent patent claims.

The flap transfer valve according to the invention for the transfer of semiconductor elements or substrates into a semiconductor or substrate processing process chamber which can be isolated in a gas-tight manner has an elongated, in particular slot-like, first opening, which extends along a geometric first longitudinal axis and is surrounded in the form of a frame by a first sealing surface. The first sealing surface lies on a geometric first sealing plane. Elongated and slot-like should be understood as meaning that the width of the, in particular rectangular, first opening along its first longitudinal axis is at least twice or three times, in particular four times, five times, six times, eight times, ten times or twelve times, the height of the first opening at right angles to the first longitudinal axis. The width of the first opening is, for example, more than 500 millimeters, in particular more than 800 millimeters, and especially more than 1000 millimeters. The first longitudinal axis extends along the width of the opening, and runs at right angles to the opening axis which forms the normal to the opening cross section.

An elongated valve closure beam is provided in order to allow the first opening to be closed in a gas-tight manner. The elongated valve closure beam preferably has a rectangular cross section, which corresponds to the preferably rectangular cross section of the first opening and overlaps the first opening all round, such that the first opening can be completely covered by means of the valve closure beam. The said width and height ratios of the first opening therefore also apply to the valve closure beam. The valve closure beam extends along a geometric second longitudinal axis, which is essentially parallel to the first longitudinal axis. In other words, the second longitudinal axis extends along the width of the valve closure beam, and runs parallel to the first longitudinal axis. In general, a valve closure beam means an elongated valve closure, in particular a broad valve plate. The valve closure beam has a front face and a rear face. The first opening can be closed by means of the front face, which faces the first opening. For this purpose, a closure surface for closing the first opening and a second sealing surface, which corresponds to the first sealing surface and can be brought into gas-tight contact with it, are provided on the front face. This second sealing surface is located in the edge area of the closure surface and lies on a geometric second sealing plane. In other words, a gas-tight contact can be made with the first sealing surface, which runs all round the first opening, by pressing the second sealing surface of the valve closure beam on essentially at right angles, wherein, when this gas-tight contact is made, the first sealing surface and the second sealing surface are parallel and lie on one another on a common plane.

In one possible embodiment, the first sealing surface is, in particular, a flat valve seat all round the first opening. The second sealing surface is formed by, for example, an elastic seal, in particular an O-ring, which is arranged on the closure surface on the front face of the valve closure beam. However, the seal may also be formed by the first sealing surface. In other words, the elastic seal can be located either on the valve closure beam or in the edge area of the first opening.

At least one support, on which the valve closure beam is mounted and which supports the valve closure beam, is located on the rear face of the valve closure beam. The support is used to support the valve closure beam and to make it possible to introduce a force to the rear face of the valve closure beam, and therefore to allow the valve closure beam to be moved.

The support is coupled to a pivoting bearing. The pivoting bearing allows the support and the valve closure beam arranged on it to be pivoted between a closed position and an open position about a geometric pivoting axis which is essentially parallel to the second longitudinal axis of the valve closure beam, and therefore also to the first longitudinal axis of the first opening.

In the closed position, the closure surface of the valve closure beam covers the first opening, and closes the first opening in a gas-tight manner, with the first sealing surface and the second sealing surface making a gas-tight contact with one another. In other words, the valve closure beam is pivoted onto the first opening, and closes it, in the closed position. The gas-tight contact is made and maintained by exertion of a force which is applied to the rear face by means of the support. In this closed position, the first sealing plane of the first sealing surface of the first opening and the second sealing plane of the second sealing surface of the valve closure beam lie on one another.

In the open position, the valve closure beam is pivoted away from the first opening. The valve closure beam therefore releases the first opening. The valve closure beam is preferably pivoted completely out of the projection of the opening cross section when in the open position, thus allowing substrates and semiconductor elements to be transferred through the first opening without any impediment. The pivoting angle of the valve closure beam between the open position and the closed position is preferably about 90 degrees, in particular between 60 and 105 degrees. However, it is also possible for the valve closure beam to be pivoted away from the closed position through only a very small pivoting angle of, for example, between 5 and 30 degrees when in the open position, and to be moved transversely out of the opening cross section in the form of a further movement, for example a lateral movement with respect to the pivoting axis, for example by means of a linear movement parallel to the first sealing plane, or a further pivoting movement, wherein the further pivoting axis essentially forms a normal to the first sealing plane.

The pivoting bearing in general functionally means a bearing which allows the valve closure beam to be pivoted about the geometric pivoting axis. The following text and the exemplary embodiments will describe in more detail which structural features can be used to implement a pivoting bearing such as this.

There is a pivotable connection between the valve closure beam and the support, which is designed such that the valve closure beam can pivot about a geometric tilting axis relative to the support. This tilting axis runs parallel to the second longitudinal axis, and also parallel to the pivoting axis, about which the support and the valve closure beam can be pivoted jointly, by means of the pivoting bearing, between the closed position and the open position. The tilting axis preferably runs centrally in the valve closure beam between the effective second sealing surface. The pivoting angle through which the valve closure beam can pivot relative to the support is limited.

According to the invention, the pivoting axis about which the support and the valve closure beam can be pivoted jointly by means of the pivoting bearing between the closed position and the open position lies essentially on the first sealing plane of the first sealing surface of the first opening. In one specific embodiment, this geometric pivoting axis lies on the geometric first sealing plane.

Likewise according to the invention, the tilting axis about which the valve closure beam can be pivoted relative to the support with the limited pivoting angle lies essentially on the second sealing plane of the second sealing surface of the valve closure beam. In one specific embodiment, the geometric tilting axis lies on the geometric second sealing plane.

Because of this specific arrangement, both the pivoting axis and the tilting axis lie on a common plane when in the closed position, specifically on the first sealing plane and the second sealing plane, lying one on top of the other. This means that, when the second sealing surface of the valve closure beam is placed on the first sealing surface of the first opening, there is essentially no lateral shear load on the sealing contact between the first sealing surface and the second sealing surface shortly before reaching the closed position, in which case the first sealing plane and the second sealing plane may be aligned slightly inclined with respect to one another, while the valve closure beam is being pushed onto the first sealing surface. The valve closure beam is pressed essentially at right angles onto the first sealing surface.

In other words, the arrangement of the pivoting axis and of the tilting axis according to the invention means that there is essentially no lateral movement of the sealing surfaces with respect to one another when the first sealing surface and the second sealing surface are moved from the virtually closed position to the closed position. The sealing surfaces are therefore protected, the life of the sealing surfaces is increased, and particle generation as a result of wear on the sealing surfaces is avoided.

A further effect of the invention is that, when there is a high load on the flap transfer valve because of high pressure differences, thus resulting in deformation of the wall around the first opening, the first sealing surface and/or the valve closure beam, further pivoting of the valve closure beam and of the support about the pivoting axis by means of the pivoting bearing leads essentially to no lateral movement between the first sealing surface and the second sealing surface, since the valve closure beam is pushed essentially at right angles onto the first sealing surface, without any significant lateral movement.

The pivotable connection between the support and the valve closure beam can be formed by at least one tilting joint, at least one ball joint and/or at least one pivoting joint and/or at least one other joint which allows at least one rotational degree of freedom about the tilting axis. In general, the pivotable connection functionally means a coupling which can pivot about the tilting axis between the valve closure beam and the support.

The second sealing surface, which is located in the edge area of the closure surface, is preferably set back in the direction of the rear face of the valve closure beam such that the closure surface of the valve closure beam, at least in a central area of the valve closure beam, projects beyond the second sealing plane in the direction of the front face of the closure beam. In other words, in the central area, which is located between the second sealing surface at the edge and is surrounded and enclosed by it, the valve closure beam extends beyond the second sealing plane in the direction of the first opening, projects into the first opening when in the closed position, and projects beyond the first sealing plane of the first opening. A recess is formed on the rear face of the valve closure beam, at least in the central area of the valve closure beam, and extends at least as far as the second sealing plane in the direction of the front face, and therefore in the direction of the first opening. In general, the recess represents a depression, which does not continue as far as the front face, on the rear face of the valve closure beam, and whose depth extends as far as the geometric second sealing plane. The geometric tilting axis passes through the area of the recess. The pivotable connection between the valve closure beam and the support, in particular the at least one tilting joint, ball joint, pivoting joint or other joint, is arranged in the recess in the valve closure beam.

According to a further aspect of the invention, the pivotable connection is formed by the at least one recess and at least one projection on the support. The projection and the recess are designed and arranged such that the projection projects into the recess, and a contact exists between the projection and the recess such that the valve closure beam can pivot about the tilting axis relative to the support. The projection in general means a section of the support which can be inserted into the recess and, by contact with the recess, forms a pivotable connection. This may be a wedge, journal, pin, bolt, ball, cone or cylindrical section, with the recess having a shape which corresponds essentially to it.

In one development of the invention, the pivotable connection is in the form of a tilting joint. The preferred design of this tilting joint will be explained in the following text. The recess has a base. This preferably means the point, the lines or the surface of the recess which is deepest, that is to say is closest to the front face. The projection has a cross section which converges to a point and has a point, with respect to the geometric plane through which the tilting axis and the second longitudinal axis pass at right angles. There is a point or line contact on the tilting axis between this point and the base, and this forms the tilting joint. In other words, a point of the projection, which is essentially in the form of a point or is in the form of a line along the tilting axis, lies on the base of the recess. The pivoting about the tilting axis takes place about this point.

In particular, the projection has a V-shaped cross section, and the point of the projection is formed by the V-angle of the cross section, which converges to a point. In particular, the projection may therefore have a shape which is like a pointed cone or a wedge, with the point being formed essentially by a point through which the tilting axis essentially passes, or a line which extends at least partially along the tilting axis.

In particular, the recess has a cross section which converges inwards, in particular a concave cross section, with respect to the geometric plane through which the tilting axis and the second longitudinal axis pass at right angles. For example, the recess has a V-shaped cross section. The base is in this case formed by the V-angle, which converges bluntly. The recess is preferably in the form of a groove which extends at least partially along the tilting axis, with the base of the groove running on the second sealing plane. In this case, the projection is preferably in the form of a wedge which extends along the tilting axis.

If both the recess and the projection have a V-shaped cross section, the V-angle of the recess is preferably greater than the V-angle of the projection, thus allowing the point of the projection to be passed completely into the recess, coming to rest in the converging base of the recess.

This tilting bearing according to the invention has a number of major advantages. Because of the contact in the form of a point or line between the projection and the recess, the contact area of the bearing is minimized. The small contact area also results in a small friction area, which in turn leads to the particle generation caused by friction being minimized. The bearing of the valve closure beam according to the invention on the support therefore causes scarcely any particles that are hazardous to the process. A further advantage of the bearing according to the invention is that the tilting axis can be placed on the second sealing plane without the recess necessarily having to project beyond the second recess. The bearing according to the invention therefore allows the valve closure beam to be designed to be flat and compact. In addition, the bearing according to the invention is distinguished by being maintenance-friendly and being subject to little wear.

In one development of the invention, a spring arrangement is located between the valve closure beam and the support.

This spring arrangement is arranged such that the valve closure beam is held on the support, and the projection is pushed into the recess, in a direction at right angles to the second sealing plane. The spring arrangement is formed, for example, by at least one leaf spring, which is arranged on the rear face of the valve closure beam and transversely with respect to the tilting axis, behind the projection which projects into the recess, such that the spring arrangement presses the projection into the recess, in a direction at right angles to the second sealing plane.

In order to limit the pivoting angle of the valve closure beam relative to the support about the tilting axis in a defined manner, the invention also provides a pivot stop, which limits the pivoting angle, between the valve closure beam and the support. At least one spring between the valve closure beam and the support presses the valve closure beam against the pivot stop in the open position, or when the valve closure beam is in a position in which it is not pressed against the first sealing surface, as a result of which the valve closure beam assumes a defined basic position. In this defined basic position, the valve closure beam is tilted with respect to the support when in the open position such that, during pivoting of the support and of the valve closure beam by means of the pivoting bearing from the open position to the closed position while making the first contact between the first sealing surface and the second sealing surface, these sealing surfaces come to rest flat on one another. At least one of the sealing surfaces is preferably elastic. This means that there is a certain pivoting angle, referred to in the following text as the pressure pivoting angle, between the first contact of the sealing surfaces, in which case the sealing surfaces come to rest on one another at least in one subsection without any pressure, and the closed position, in which the two sealing surfaces are pressed against one another such that a gas-tight contact is made. In one preferred embodiment of the invention, the valve closure beam is tilted through this pressure pivoting angle about the tilting axis in the basic position. This means that, when the first contact is made between the sealing surfaces during the closing process, the second sealing surface is aligned parallel to the first sealing surface, as a result of which the sealing surfaces come to rest uniformly and flat on one another. The arrangement according to the invention of the tilting axis and of the pivoting axis results in there being no significant lateral load on the sealing surfaces in a direction parallel to the sealing planes when further pressure is applied to the sealing surfaces.

A further aspect of the invention includes a pivoting shaft, which extends parallel to the first longitudinal axis of the first opening and along the pivoting axis, being arranged adjacent to the first opening, to which pivoting shaft the support is attached in order to pivot about the pivoting axis. By way of example, the pivoting shaft is mounted such that it can rotate on that wall of the valve housing of the flap transfer valve which contains the first opening. At least one arm, which extends at least partially at right angles to the pivoting axis, can be arranged on the pivoting shaft such that they rotate together, to which arm the support is fixed indirectly or directly. This pivoting shaft can have merely a bearing function, such that the valve closure beam is mounted such that it can pivot about the pivoting axis, or else may have a drive function for pivoting the valve closure beam.

Various options are known from the prior art for using a pivoting bearing and a suitable drive to pivot a valve closure beam of a flap transfer valve between an open position and a closed position. One option is to drive the abovementioned pivoting shaft directly by means of a drive such that it can rotate. A drive such as this is described, for example, in EP 0 554 522. One advantage of a drive such as this is the simple design. However, this has the disadvantage that a very high torque acts on the pivoting shaft because of the long lever arm and, particularly in the case of large sealing surfaces and high pressure differences, torsions and elastic deformation of the arms are unavoidable, as a result of which the required gas-tightness is no longer ensured in certain applications.

A further aspect of the invention is therefore for the described flap transfer valve to have a shaft which can rotate about a shaft axis, which is essentially parallel to the second longitudinal axis, is at a distance from the pivoting axis, in particular in a direction at right angles to the first sealing plane, and rests on the rear face of the valve closure plate. At least one drive is coupled to the shaft in order to rotate this shaft about the shaft axis and to move the valve closure beam between the open position and the closed position. At least one first arm, which is arranged on the shaft such that they rotate together, is located between the shaft and the support. The free end of the first arm engages directly or indirectly via the support with the rear face of the valve closure beam, such that rotation of the shaft, and therefore pivoting of the first arm, about the shaft axis can result in a force being applied to the rear face of the valve closure beam in order to pivot the valve closure beam about the pivoting axis between the open position and the closed position.

In other words, the flap transfer valve has, for example, a shaft which is mounted such that it can rotate about its shaft axis, which extends centrally along the shaft. The shaft axis runs essentially parallel to the second longitudinal axis of the valve closure beam, and therefore also to the first longitudinal axis of the first opening. This shaft is operatively connected to the valve closure beam such that rotation of the shaft about the shaft axis causes the valve closure beam to pivot about the pivoting axis. At least one drive is coupled to the shaft, in order to rotate the shaft about the shaft axis. Because of the operative connection of the shaft to the valve closure beam, rotation of the shaft moves the valve closure beam between the open position and the closed position. By way of example, the drive may be a rotary drive, and the rotary movement which is produced by it leads directly or indirectly to a rotary movement of the shaft, or may be a linear drive, whose axial movement is converted to a rotary movement of the shaft, in particular by means of a lever which is arranged directly or indirectly on the shaft.

One development of the invention provides for the valve closure beam, the support, the pivoting bearing and the shaft to be arranged in a valve housing. The first opening is arranged on a first opening face of the valve housing. A second opening, opposite the first opening, is arranged on a second opening face of the valve housing, opposite the first opening face.

In one possible embodiment, the second opening is opposite the first opening in the valve housing. The openings each connect the interior of the valve housing to the exterior of the valve housing, in which case at least the first opening can be closed by the closure by means of the valve closure beam, and the connection relating to this of the valve interior to the valve exterior can thus be disconnected. That outer face of the valve housing which is opposite the outer first opening face is referred to as the second opening face of the valve housing. Opposite does not necessarily mean an exactly geometrically opposite position, but in general that the first opening face and the second opening face point in different directions. However, it is also possible for the valve housing to have no such second opening.

In one development of the invention, a second arm is in each case associated with the at least one first arm and is mounted on the support on the rear face of the valve closure beam such that it can pivot about a second arm axis, which runs parallel to the pivoting axis. The first arm and the second arm are connected to one another in an articulated manner at each of their free ends, about a first arm axis which is essentially parallel to the second arm axis. The shaft, the first arm and the second arm therefore form a lever drive, in particular a toggle-lever or tensioning lever mechanism. The lengths of the first arm and of the second arm, and the distances between the shaft axis, the first arm axis and the second arm axis, are preferably designed such that the shaft axis, the first arm axis and the second arm axis lie essentially on a common plane when in the closed position, and the first arm and the second arm are aligned essentially at a dead point. This dead-point alignment in the closed position means that no torque is exerted on the valve closure beam in the event of a pressure difference, as a result of which there is no torsion on the shaft.

The apparatus according to the invention and the method according to the invention will be described in more detail in the following text, purely by way of example with reference to specific exemplary embodiments which are illustrated schematically in the drawings.

In detail, in the figures:

FIGS. 1a to 1e show a common exemplary embodiment of a flap transfer valve according to the invention in various states, from different views and in different levels of detail. These figures will therefore be described jointly, and in some cases reference symbols and features which have already been explained with reference to previous figures will not be described again.

Figure 1A:
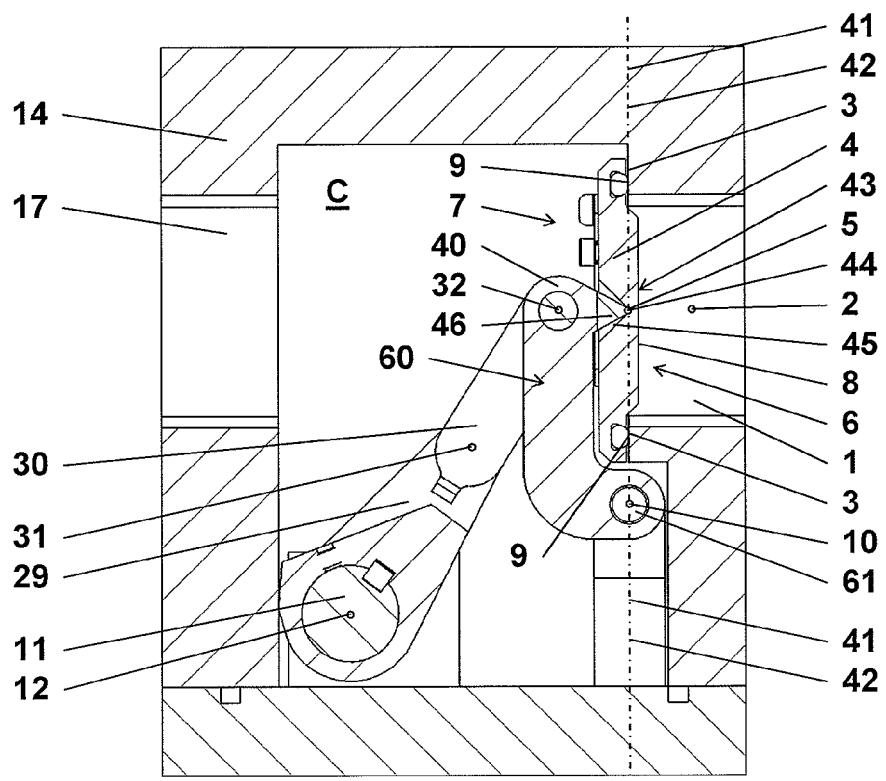
FIG. 1a shows a side cross-sectional view of one exemplary embodiment of the flap transfer valve, with the valve closure beam in a closed position.
Figure 1B:
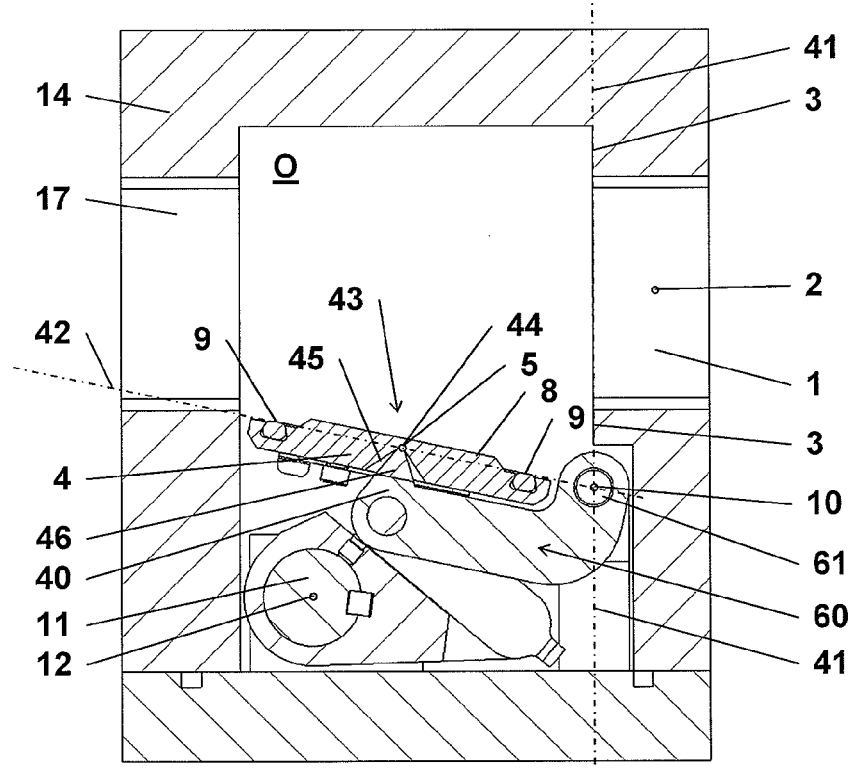
FIG. 1b shows a side cross-sectional view of the exemplary embodiment of the flap transfer valve, with the valve closure beam in an open position.
Figure 1C:
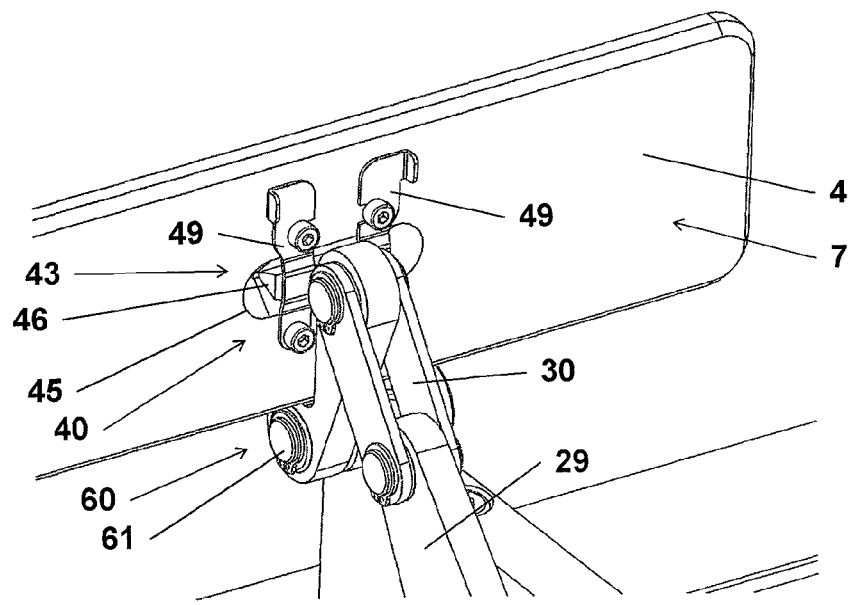
FIG. 1c shows an oblique view of the rear face of the valve closure beam.
Figure 1D:
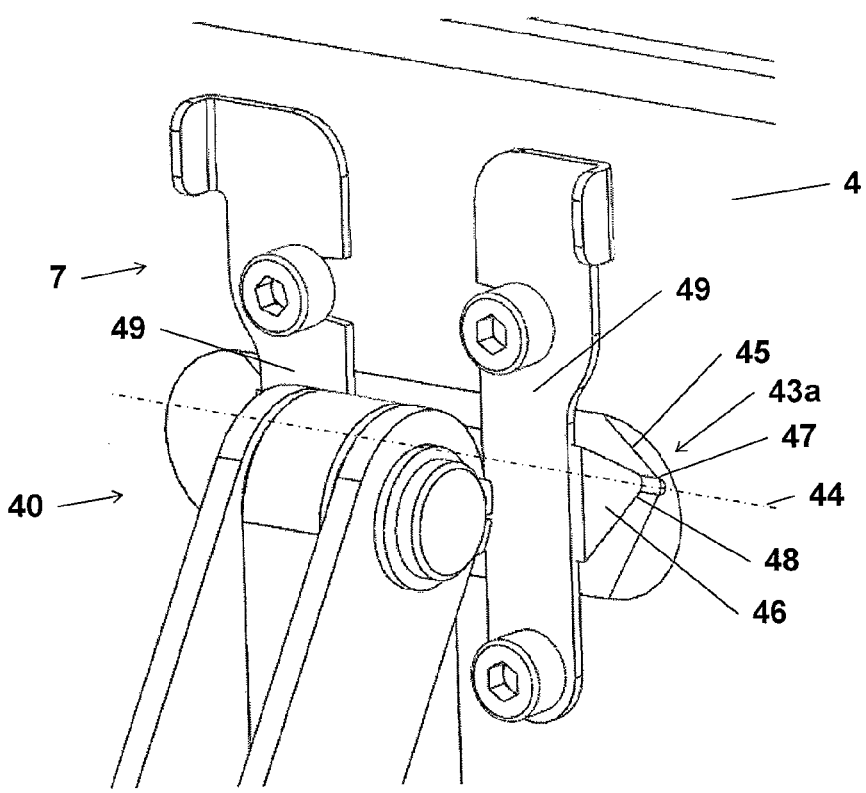
FIG. 1d shows a detailed oblique view of the pivotable connection on the rear face of the valve closure beam.
Figure 1E:
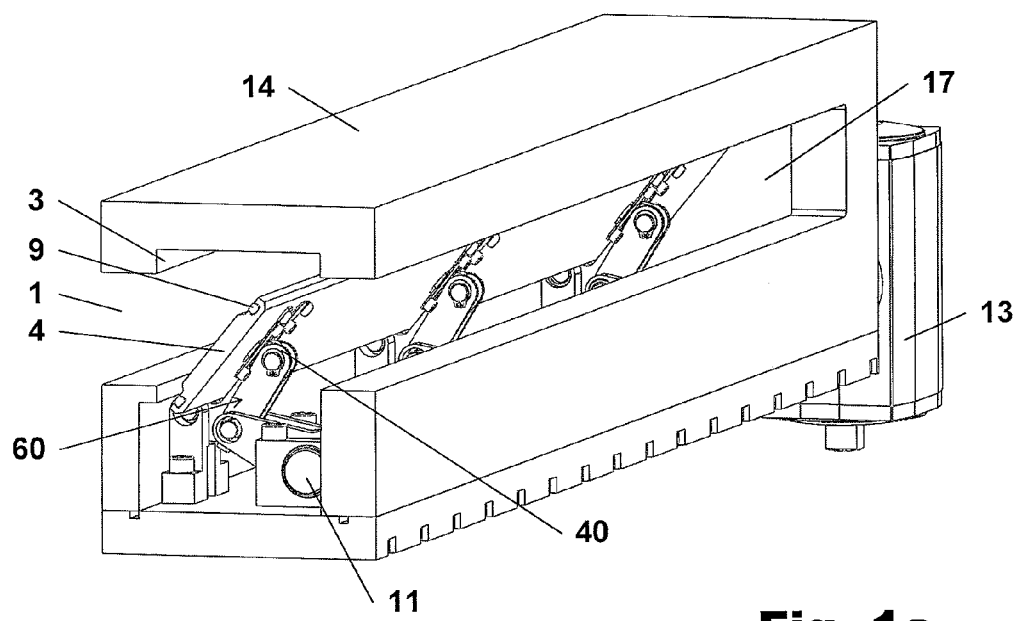
FIG. 1e shows an oblique view of the exemplary embodiment of the flap transfer valve.

The flap transfer valve for the transfer of semiconductor elements or substrates into a semiconductor or substrate processing process chamber which can be isolated in a gas-tight manner has a gas-tight valve housing 14 which is basically cuboid in shape, as can be seen in FIG. 1e. Two opposite side elongated faces form a first opening face and a second opening face of the valve housing 14. An elongated, slot-like first opening 1 is formed on the first opening face of the valve housing 14 and has a rectangular cross section, as can be seen in FIGS. 1a, 1b and 1e. The first opening 1 is opposite a second opening 17, which is located on the second opening face of the valve housing 14. The two openings 1 and 17 have essentially the same elongated slot-like cross section, and their projections are aligned. In other words, the two openings 1 and 17 have a common opening axis. The first opening 1 extends along a first longitudinal axis 2 and is surrounded in the form of a frame by a first sealing surface 3, as is shown in FIGS. 1a, 1b and 1e. The first sealing surface 3 runs on a first sealing plane 41 and forms a flat valve seat, facing the valve interior.

An elongated valve closure beam 4 is arranged in the valve housing and extends along a second longitudinal axis 5, which is essentially parallel to the first longitudinal axis 2, as shown, inter alia, in FIGS. 1a and 1b. The valve closure beam 4 has a cross section which corresponds essentially to the cross sections of the openings 1 and 17, but is somewhat larger, as a result of which it can cover the first opening 1.

In the illustrated exemplary embodiment, the width of the two openings 1 and 17 and of the valve closure beam 4 is more than six times the respective height. The cross sections therefore extend essentially more in width, that is to say in length, than in height, as a result of which the cross sections are referred to as being elongated.

A closure surface 8 for closing the first opening 1 is located on a front face 6 of the valve closure beam 4. In addition, a second sealing surface 9, in the form of an O-ring, is arranged in the edge area of the closure surface 8. The O-ring 9 corresponds to the first sealing surface 3, that is to say it can be brought into gas-tight contact with the first sealing surface 3, as is shown in FIG. 1a. The effective area of the O-ring 9, that is to say the second sealing surface 9, lies on a second sealing plane 42, as shown in FIGS. 1a and 1b. Since, in FIG. 1a, the flap transfer valve is located in the closed position C, the first sealing plane 41 and the second sealing plane 42 coincide there.

A plurality of identical supports 40 are arranged along the second longitudinal axis 5 on the rear face 7 of the valve closure beam 4, as can be seen in particular in FIG. 1e. However, for better illustrative purposes, the following text is based on a single support 40. The support 40 forms the interface between the valve closure beam 4 and a pivoting bearing 60. The valve closure beam 4 is arranged on the support 40 such that it can pivot about a tilting axis 44, which is parallel to the second longitudinal axis 5, via a pivotable connection 43, which will be explained in more detail in the following text.

A pivoting shaft 61, which extends parallel to the first longitudinal axis 2 of the first opening 1 and along a pivoting axis 10, is arranged adjacent to the first opening 1. The support 40 is attached to this pivoting shaft 61 via an arm, in order to pivot about the pivoting axis 10. The valve closure beam 4 is therefore mounted such that it can pivot about the pivoting axis 10. The pivoting axis 10 runs at the side of the first opening 1, specifically according to the invention on the first sealing plane 41, as is shown in FIGS. 1a and 1b.

The pivotable bearing of the valve closure beam 4 about the pivoting axis 10 which is parallel to the second longitudinal axis 5 functionally forms the pivoting bearing 60 by means of which the valve closure beam 4 can be pivoted about the pivoting axis 10 between a closed position C, FIG. 1a, and an open position O, FIG. 1b, with a pivoting angle of about 80°. In the closed position C, FIG. 1a, the closure surface 8 of the valve closure beam 4 covers the first opening 1, and closes it.

In this closed position C, the first sealing surface 3 and the second sealing surface 9 make a gas-tight contact with one another, with the first sealing plane and the second sealing plane 42 resting on one another, as shown in FIG. 1a. In the open position O, the valve closure beam 4 is pivoted away from the first opening 1, and releases the first opening 1.

A shaft 11 is mounted radially on the valve housing 14 such that it can rotate, and can rotate about a shaft axis 12, which is essentially parallel to the second longitudinal axis 5 of the valve closure beam 4, as shown in FIGS. 1a, 1b and 1e. The shaft axis 12 runs in a direction at right angles to the first sealing plane 41 of the first sealing surface 3, at a distance from the pivoting axis 10. The pivoting axis 10 of the pivoting shaft 61 runs through that half of the valve housing 14 which faces the first opening face, while in contrast the shaft axis 12 of the shaft 11 runs through that half of the valve housing 14 which faces the second opening face, as can be seen in FIGS. 1*a* and 1*b*.

One first arm 29 is in each case arranged on the shaft 11 such that they rotate together. The total of three first arms 29, as shown in FIG. 1*e*, run parallel to one another and at right angles to the shaft axis 12. The first arms 29 can be pivoted about the shaft axis 12 by rotation of the shaft 11.

The first arms 29 are each associated with one second arm 30. The second arm 30 is mounted on the support 40 on the rear face 7 of the valve closure beam 4 such that it can pivot about a second arm axis 32 which runs parallel to the pivoting axis 10. The respective first arm 29 and second arm 30 are connected to one another at their free ends such that they are articulated about a first arm axis 31, which is essentially parallel to the second arm axis 32. The shaft 11, the first arms 29 and the second arms 30 therefore form a lever drive. The respective first arm 29 therefore engages via the second arm 30 with the support 40 on the rear face 7 of the valve closure beam 4 such that rotation of the shaft 11, and therefore pivoting of the first arms 29, about the shaft axis 12 allows a force to be applied to the rear face 7 of the valve closure beam 4, in order to pivot the valve closure beam 4 about the pivoting axis 10 between the open position O and the closed position C.

The lengths of the first arms 29 and of the second arms 30, and the distances between the shaft axis 12, the first arm axis 31 and the second arm axis 32 are such that the shaft axis 12, the first arm axis 31 and the second arm axis 32 lie essentially on a common plane in the closed position C, as shown in FIG. 1*a*, and the first arms 29 and the second arms 30 are aligned essentially at the dead point.

The shaft 11, which can rotate about the shaft axis 12, is therefore operatively connected via the arms 29 and 30 to the support 40 and the valve closure beam 4 such that rotation of the shaft 11 about the shaft axis 12 causes the valve closure beam 4 to pivot about the pivoting axis 10.

A drive 13 in the form of an electric motor is arranged at the side on the valve housing 14 in order to rotate the shaft 11 about the shaft axis 12, and in order to move the valve closure beam 4 between the open position O and the closed position C, as shown in FIG. 1*e*.

According to the invention, there is a pivotable connection 43 about the tilting axis 44, which runs parallel to the second longitudinal axis 5, between the support 40, which is arranged on the rear face 7 of the valve closure beam 4, and the valve closure beam 4, with the tilting axis 44 lying on the second sealing plane 42, as is shown in FIGS. 1*a* and 1*b*.

The second sealing surface 9, which is located in the edge area of the closure surface 8, is set back in the direction of the rear face 7, as is shown in FIGS. 1*a* and 1*b*. The closure surface 8 therefore projects in a central area, which is surrounded by the O-ring 9, beyond the second sealing plane 42 in the direction of the front face 6 of the valve closure beam 4, as is shown in FIGS. 1*a* and 1*b*. In other words, in the closed position C, the closure surface 8 projects beyond the first sealing plane 41 into the first opening 1, as is shown in FIG. 1*a*.

A recess 45 is in each case formed for each support 40 in the central area of the valve closure beam 4, on the rear face 7 of the valve closure beam 4, and extends onto the second sealing plane 42 in the direction of the front face 6. The recess 45, which runs longitudinally along the tilting axis 44 and is formed centrally in the valve closure beam 4, is in each case formed by a V-shaped groove which extends at least partially along the tilting axis 44, with the base 47 of the groove 45 being in the form of a line along the tilting axis 44, and therefore running on the second sealing plane 42.

In other words, this recess 45 has a V-shaped cross section, which converges inwards, with respect to an imaginary plane through which the tilting axis 44 and the second longitudinal axis 5 pass at right angles, that is to say the cross-sectional plane in FIGS. 1*a* and 1*b*. The base 47 of the recess 45, FIG. 1*d*, is formed by the V-angle which converges bluntly, as is shown in FIGS. 1*a*, 1*b* and 1*d*, and the tilting axis 44 passes through it.

Each of the supports 45 has in each case one projection 46. The projection 46 is in the form of a wedge which extends along the tilting axis 44 and has a V-shaped cross section, and the projection 46 has a point 48 in cross section which is formed by the V-angle which converges to a point. In other words, the projection 46 is wedge-shaped with a pointed ridge 48 which is in the form of a line. The projection 46 has a cross section which converges to a point, with a point 48, with reference to an imaginary plane through which the tilting axis 44 and the second longitudinal axis 5 pass at right angles, that is to say the cross-sectional view shown in FIGS. 1*a* and 1*b*.

The V-angle of the recess 45 is greater than the V-angle of the projection 46, as a result of which the projection 46 can project completely into the recess 45, with the ridge 48, which is in the form of a line, to be precise the point 48 of the projection 46, resting on the base 47, which is in the form of a line, of the recess 45. Between the point 48, to be precise the ridge 48, and the base 47, there is therefore a line contact, which is located on the tilting axis 44, between the projection 46 and the recess 45, such that the valve closure beam 4 can pivot about the tilting axis 41 relative to the support 40. This contact forms a pivotable connection 43 in the form of a tilting joint 43*a*.

A spring arrangement 49 in the form of in each case two leaf springs mounted on the rear face 7 is arranged between the valve closure beam 4 and the support 40. The leaf springs 49 are mounted transversely with respect to the tilting axis 44, behind the projection 46 which projects into the recess 45, such that the valve closure beam 4 is held on the support 40 and the projection 46 is pressed into the recess 45, as is shown in FIGS. 1*c* and 1*d*. The leaf springs 49 are attached by means of screws transversely via the recess 45, which is in the form of a groove, and via the projection 46, which projects into the recess 45, thus resulting in a connection, which can pivot in a sprung manner about the tilting axis 44, between the support 40 and the closure beam 4.

The arrangement according to the invention of the pivoting axis 10 on the first sealing plane 41 and of the tilting axis 44 on the second sealing plane 42, which is made possible in particular by means of the bearing arrangement according to the invention, makes it possible to prevent lateral movement of the sealing surfaces 3 and 9 when the valve closure beam 4 is being pressed on when being moved to the closed position C, FIG. 1*a*, as a result of which the O-ring 9 is subject only to a very small amount of wear, and its life is considerably increased. Because of the line contact between the projection 46 and the recess 45, the friction-dependent generation of particles is kept low, thus ensuring the required freedom from particles.

Figure 2:
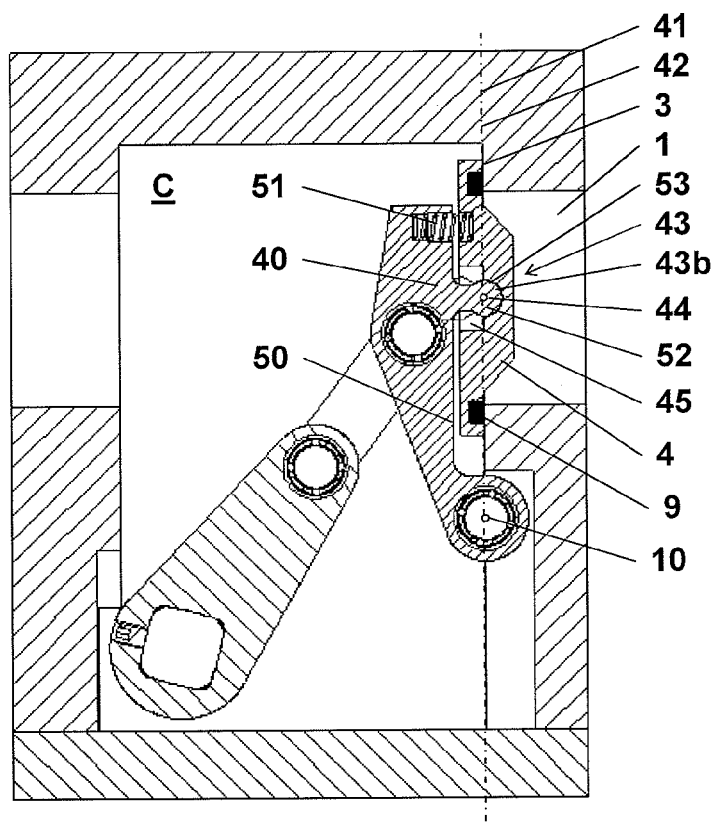
FIG. 2 shows a side cross-sectional view of a first alternative exemplary embodiment of the flap transfer valve, with the valve closure beam in a closed position.
Figure 3:
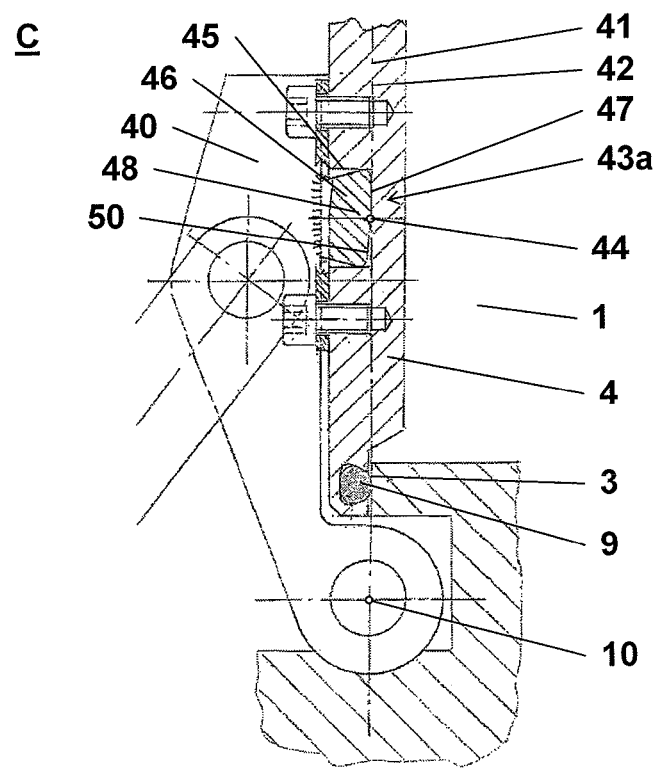
FIG. 3 shows a side cross-sectional view of a second alternative exemplary embodiment of the flap transfer valve, with the valve closure beam in a closed position.
Figure 4:
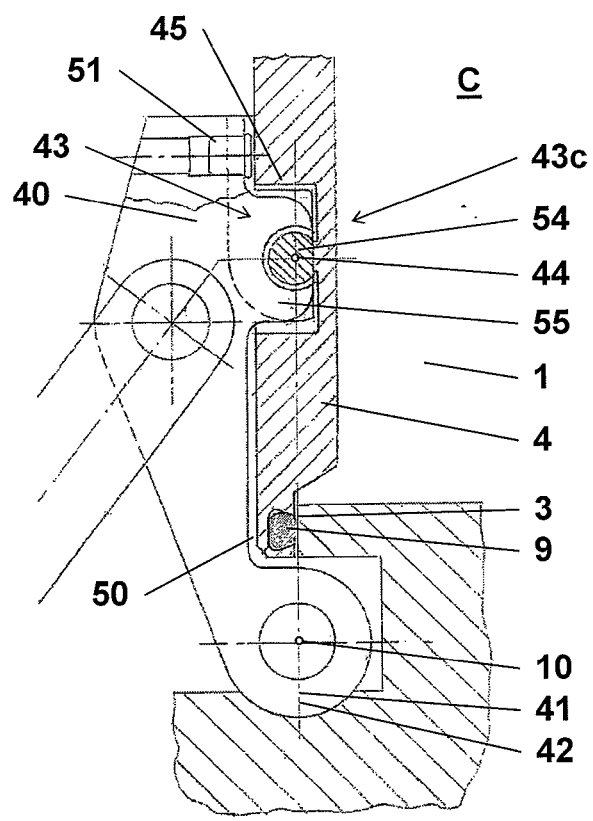
FIG. 4 shows a side cross-sectional view of a third alternative exemplary embodiment of the flap transfer valve, with the valve closure beam in a closed position.

According to the invention, instead of the tilting joint 43*a* as described in FIGS. 1*a* to 1*e*, it is also possible to use a different embodiment of a tilting joint 43*a*, for example as shown in FIG. 3, or a different joint with a tilting axis 44 which lies on the second sealing plane 42, for example a ball joint 43b, FIG. 2, or a pivoting joint 43c, FIG. 4. Possible alternative embodiments will be described non-exclusively in the following text, describing only the differences from the already explained embodiment.

FIG. 2 shows a pivotable connection 43 between the support 40 and the valve closure beam 4, which connection 43 is formed by at least one ball joint 43b. The ball joint 43b is formed by a ball 52, which is formed in the support 40, and a corresponding ball holder 53, which is formed in the recess 45. The center of the ball 52 and of a corresponding ball holder 53 is located on the tilting axis 44, and therefore on the second sealing plane 42, with respect to the plane through which the tilting axis 44 and the second longitudinal axis 5 pass at right angles, that is to say the cross-sectional plane as shown in FIG. 2.

Furthermore, the alternative embodiment shown in FIG. 2 has a pivot stop 50, which limits the pivoting angle, between the valve closure beam 4 and the support 40. A spring 51, which acts in the direction at right angles to the second sealing plane 42, is arranged between the valve closure beam 4 and the support 40. In the open position O, the spring 51 pushes the valve closure beam 4 against the pivot stop 50, such that, when in the open position O, the valve closure beam 4 is tilted with respect to the support 40 such that, during pivoting of the support 40 and of the valve closure beam 4 by means of the pivoting bearing 60 from the open position O to the closed position C when the contact is being made between the first sealing surface and the second sealing surface 9, these sealing surfaces 3 and 9 come to rest flat on one another. This arrangement can also be used in the first exemplary embodiment as shown in FIGS. 1a to 1e.

FIG. 3 shows a second alternative embodiment, in which the base 47 of the recess 45 is flat and extends on the second sealing plane 42. The projection 46 on the support 40 has a point 48 which extends along the tilting axis 44 and is in the form of an edge. In the closed position C, the edge 48 and the upper half of the projection 46 rest on the base 47. As soon as the closed position C is left, the valve closure beam 4 tilts about the tilting axis 44 and about the edge 48 onto the lower half of the projection 46, which forms the pivot stop 50, as a result of which the valve closure beam 4 is tilted, as described above, with respect to the support 40 when in the open position O. This arrangement forms a tilting joint 43a with a limited pivoting angle. Furthermore, in a corresponding manner to the exemplary embodiment shown in FIGS. 1a to 1e, the valve closure beam 4 has a spring arrangement 49, which is not illustrated in FIG. 3, for pushing the projection 46 into the recess 45.

FIG. 4 shows a third alternative embodiment with a pivoting joint 43c. A bolt section 54 which extends along the tilting axis 44 and whose center axis lies on the tilting axis 44 is located in the recess 45. The bolt section 54 is held in a bolt holder 55, which is coupled to the support 40, such that the bolt section 54 and the bolt holder 55, and therefore the valve closure beam 4 and the support 40, can be pivoted relative to one another about the tilting axis 44 which lies on the second sealing plane 42, thus forming the pivoting joint 43c. In the same way as the first alternative exemplary embodiment shown in FIG. 2, this third alternative embodiment also has a pivot stop and a spring 51, as a result of which the valve closure beam 4 assumes a defined position when the flap transfer valve is not in the closed state.

The four specific exemplary embodiments which are illustrated and explained in FIGS. 1a to 1e, 2, 3 and 4 serve only as examples to illustrate the invention on the basis of schematic illustrations. The invention is not, of course, restricted to these exemplary embodiments and their feature combinations.

The invention claimed is:

1. Flap transfer valve for the transfer of semiconductor elements or substrates into a semiconductor or substrate processing process chamber which can be isolated in a gas-tight manner, having
   an elongated first opening, which extends along a first longitudinal axis and is surrounded in the form of a frame by a first sealing surface which lies on a first sealing plane, wherein the entire first sealing surface lies on the first sealing plane,
   an elongated valve closure beam,
   which extends along a second longitudinal axis, which is parallel to the first longitudinal axis, and
   which has a closure surface on a front face for closing the first opening, and
   has a second sealing surface, which corresponds to the first sealing surface, that can be brought into gas-tight contact with the first sealing surface, and is located in the edge area of the closure surface and on a second sealing plane,
   at least one support on a rear face, which is opposite the front face, of the valve closure beam, wherein the valve closure beam is arranged such that it can pivot through a limited pivoting angle about a tilting axis, which is parallel to the second longitudinal axis, via a pivotable connection on the support, and
   a pivoting bearing, by means of which the support, together with the valve closure beam, can pivot about a pivoting axis, which is parallel to the second longitudinal axis, between
   a closed position, in which the closure surface of the valve closure beam covers and closes the first opening, and in which the first sealing surface and the second sealing surface are in gas-tight contact on the common first sealing plane and second sealing planes—by exertion of a force which is applied to the rear face by means of the support, and
   an open position in which the valve closure beam is pivoted away from the first opening and at least partially releases the first opening,
   wherein the pivoting axis lies essentially on the first sealing plane, and
   the tilting axis lies essentially on the second sealing plane.

2. The flap transfer valve according to claim 1, wherein the pivotable connection between the support and the valve closure beam is formed by at least one
   tilting joint,
   ball joint or
   pivoting joint.

3. The flap transfer valve according to claim 1,
   wherein a pivot stop, which limits the pivoting angle, between the valve closure beam and the support, and
   at least one spring between the valve closure beam and the support,
   wherein
   the at least one spring presses the valve closure beam against the pivot stop in the open position, and
   the valve closure beam is tilted with respect to the support when in the open position such that, during pivoting of the support and of the valve closure beam by means of the pivoting bearing from the open position to the closed position while making the contact between the first sealing surface and the second sealing surface, these sealing surfaces come to rest flat on one another.

4. The flap transfer valve according to claim 1,
wherein a pivoting shaft, which extends parallel to the first longitudinal axis of the first opening and along the pivoting axis, is arranged adjacent to the first opening, to which pivoting shaft the support is attached in order to pivot about the pivoting axis.

5. The flap transfer valve according to claim 1,
wherein a shaft which can rotate about a shaft axis, which is essentially parallel to the second longitudinal axis and is at a distance from the pivoting axis,
at least one drive, which is coupled to the shaft in order to rotate the shaft about the shaft axis and to move the valve closure beam between the open position and the closed position, and
at least one first arm, which is arranged on the shaft such that they rotate together and whose free end engages directly or indirectly via the support with the rear face of the valve closure beam, such that rotation of the shaft, and therefore pivoting of the first arm, about the shaft axis can result in a force being applied to the rear face of the valve closure beam in order to pivot the valve closure beam about the pivoting axis between the open position and the closed position.

6. The flap transfer valve according to claim 1, wherein, in the closed position, the first sealing surface and the second sealing surface are parallel and lie on one another on a common plane, which is the first sealing plane and the second sealing plane.

7. The flap transfer valve according to claim 1,
wherein the second sealing surface, which is located in the edge area of the closure surface, is set back in the direction of the rear face such that the closure surface—at least in a central area of the valve closure beam—projects beyond the second sealing plane in the direction of the front face of the valve closure beam, and
at least one recess is formed on the rear face of the closure beam—at least in the central area of the valve closure beam—and extends at least onto the second sealing plane in the direction of the front face, wherein the tilting axis extends in the area of the recess, and
the pivotable connection is arranged in the recess.

8. The flap transfer valve according to claim 7, wherein the pivotable connection is formed by
the at least one recess and
at least one projection on the support, wherein
the projection projects into the recess, and a contact exists between the projection and the recess such that the valve closure beam can pivot about the tilting axis relative to the support.

9. The flap transfer valve according to claim 8,
wherein the recess is in the form of a groove which extends at least partially along the tilting axis, wherein the base of the groove runs on the second sealing plane, and
the projection is in the form of a wedge which extends along the tilting axis.

10. The flap transfer valve according to claim 8, wherein a spring arrangement between the valve closure beam and the support, wherein the spring arrangement is arranged such that
the valve closure beam is held on the support, and
the projection is pushed into the recess.

11. The flap transfer valve according to claim 10, wherein the spring arrangement is in the form of at least one leaf spring, which is arranged on the rear face of the valve closure beam, presses the projection into the recess, and is arranged transversely with respect to the tilting axis, behind the projection which projects into the recess.

12. The flap transfer valve according to claim 8,
wherein the pivotable connection is in the form of a tilting joint,
the recess has a base and
the projection has a cross section which converges to a point and has a point, with respect to the plane through which the tilting axis and the second longitudinal axis pass at right angles,
wherein there is a point or line contact on the tilting axis between the point and the base, and this forms the tilting joint.

13. The flap transfer valve according to claim 12, wherein the projection has a V-shaped cross section, and the point is formed by an acute angle which is formed by the V-shaped cross-section.

14. Flap transfer valve according to claim 12, wherein the recess has a cross section which converges inwards with respect to the plane through which the tilting axis and the second longitudinal axis pass at right angles.

15. Flap transfer valve according to claim 14, wherein the recess has a V-shaped cross section, and the base is formed by the V-angle, which converges bluntly.

* * * * *